US012108692B2

(12) United States Patent
Wu et al.

(10) Patent No.: US 12,108,692 B2
(45) Date of Patent: Oct. 1, 2024

(54) THREE TERMINAL PHASE CHANGE MEMORY WITH SELF-ALIGNED CONTACTS

(71) Applicant: International Business Machines Corporation, Armonk, NY (US)

(72) Inventors: Heng Wu, Guilderland, NY (US); Tian Shen, Clifton Park, NY (US); Kevin W. Brew, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 17/473,359

(22) Filed: Sep. 13, 2021

(65) Prior Publication Data

US 2023/0081603 A1    Mar. 16, 2023

(51) Int. Cl.
*H10N 70/20*    (2023.01)
*H10N 70/00*    (2023.01)

(52) U.S. Cl.
CPC ......... *H10N 70/253* (2023.02); *H10N 70/063* (2023.02); *H10N 70/231* (2023.02); *H10N 70/823* (2023.02); *H10N 70/8413* (2023.02); *H10N 70/8828* (2023.02)

(58) Field of Classification Search
CPC .... H10B 63/10; H10N 70/231; H10N 70/253; H10N 70/823; H10N 70/8413; H10N 70/8613; H10N 70/8616
See application file for complete search history.

(56) References Cited

U.S. PATENT DOCUMENTS

| 7,494,849 | B2 | 2/2009 | Oliva et al. |
| 7,936,593 | B2 | 5/2011 | Savransky |
| 8,178,386 | B2 | 5/2012 | Lung et al. |
| 8,187,918 | B2 | 5/2012 | Oh et al. |
| 8,391,050 | B2 | 3/2013 | Ito |
| 8,767,431 | B2 | 7/2014 | Franca-Neto |
| 10,943,952 | B2 | 3/2021 | Nardi et al. |
| 11,004,511 | B2 | 5/2021 | Cohen et al. |

(Continued)

OTHER PUBLICATIONS

Kanan, "Phase Change Devices for Nonvolatile Logic," University of Connecticut, Doctoral Dissertation, May 2, 2017, 122 pages.

(Continued)

*Primary Examiner* — Robert G Bachner
*Assistant Examiner* — Molly K Reida
(74) *Attorney, Agent, or Firm* — Peter J. Edwards

(57) ABSTRACT

A phase change memory, a system, and a method to prevent high resistance drift within a phase change memory through a phase change memory cell with three terminals and self-aligned metal contacts. The phase change memory may include a bottom electrode. The phase change memory may also include a heater proximately connected to the bottom electrode. The phase change memory may also include a phase change material proximately connected to the heater. The phase change memory may also include metal proximately connected to at least two sides of the phase change material. The phase change memory may also include three terminals, where a bottom terminal is located at an area proximately connected to the heater and two top terminals are located at areas proximately connected to the metal.

17 Claims, 14 Drawing Sheets

(56) References Cited

U.S. PATENT DOCUMENTS

| | | | |
|---|---|---|---|
| 2006/0001017 A1* | 1/2006 | Chang | H10N 70/8828 |
| | | | 257/3 |
| 2007/0096071 A1* | 5/2007 | Kordus | G11C 13/0004 |
| | | | 257/E45.002 |
| 2007/0181882 A1* | 8/2007 | Lee | H01L 27/0688 |
| | | | 257/67 |
| 2014/0061580 A1 | 3/2014 | Krebs et al. | |

OTHER PUBLICATIONS

Lo et al., "Three-Terminal Probe Reconfigurable Phase-Change Material Switches," IEEE Transactions on Electron Devices, vol. 57, No. 1, Jan. 2010, 9 pages.

Kim et al., "One-Dimensional Thickness Scaling Study of Phase Change Material (Ge2Sb2Te5) Using a Pseudo 3-Terminal Device," IEEE Transactions on Electron Devices, vol. 58, No. 5, May 2011, 7 pages.

Tian Shen et al., "A Phase Change Material Switch and Method of Fabricating Same," U.S. Appl. No. 16/821,660, filed Mar. 17, 2020.

Philip et al., "Multi-Terminal Phase Change Memory Device," U.S. Appl. No. 16/828,242, filed Mar. 24, 2020.

* cited by examiner

THREE TERMINAL PHASE CHANGE MEMORY WITH SELF-ALIGNED CONTACTS

BACKGROUND

The present disclosure relates to phase change memory and, more specifically, to preventing high resistance drift within a phase change memory through a phase change memory cell with three terminals and self-aligned metal contacts.

Phase change memory (PCM) is a non-volatile random access memory (NVRAM). PCMs contain phase-change materials (such as alloys containing Tellurium) and may alter the states (e.g., crystalline and amorphous phases) of the PCM using heat. The phase-change materials may be placed between two electrodes, and when the phase-change materials are in a crystalline state the phase-change materials have a high conductivity and a low resistivity (which corresponds to a logical 1), allowing current to travel quickly thorough the phase-change materials and between electrodes. When the phase-change materials are in an amorphous state, the materials have a low conductivity and a high resistivity (which corresponds to a logical 0), preventing current from travelling quickly through the phase-change materials and between the electrodes. The portions of the phase-change material that are amorphous and crystalline may be controlled to achieve intermediate conductivity values, for use in analog computing. The data is stored using the contrast between resistances of the multiple states. The PCM is a non-volatile memory, as the states can remain if/when power is removed, allowing PCMs to retain data even when there is no power.

SUMMARY

The present invention provides a phase change memory, a system, and a method to prevent high resistance drift within a phase change memory through a phase change memory cell with three terminals and self-aligned metal contacts. The phase change memory may include a bottom electrode. The phase change memory may also include a heater proximately connected to the bottom electrode. The phase change memory may also include a phase change material proximately connected to the heater. The phase change memory may also include metal proximately connected to at least two sides of the phase change material. The phase change memory may also include three terminals, where a bottom terminal is located at an area proximately connected to the heater and two top terminals are located at areas proximately connected to the metal.

The system may include a phase change memory cell. The phase change memory cell may include a bottom electrode. The phase change memory cell may also include a heater proximately connected to the bottom electrode. The phase change memory cell may also include a phase change material proximately connected to the heater. The phase change memory cell may also include metal proximately connected to at least two sides of the phase change material. The phase change memory cell may also include three terminals, where a bottom terminal is located at an area proximately connected to the heater and two top terminals are located at areas proximately connected to the metal.

The method of forming the three terminal phase change memory may include depositing a phase change material proximately connected to the heater, where the heater is proximately connected to a bottom electrode. The method may also include depositing a hard mask on the phase change material. The method may also include patterning the phase change material and the hard mask. The method may also include depositing a metal on a dielectric such that the metal is proximately connected to the phase change material and the hard mask, where a bottom terminal is located at an area proximately connected to the heater and two top terminals are located at areas proximately connected to the metal.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
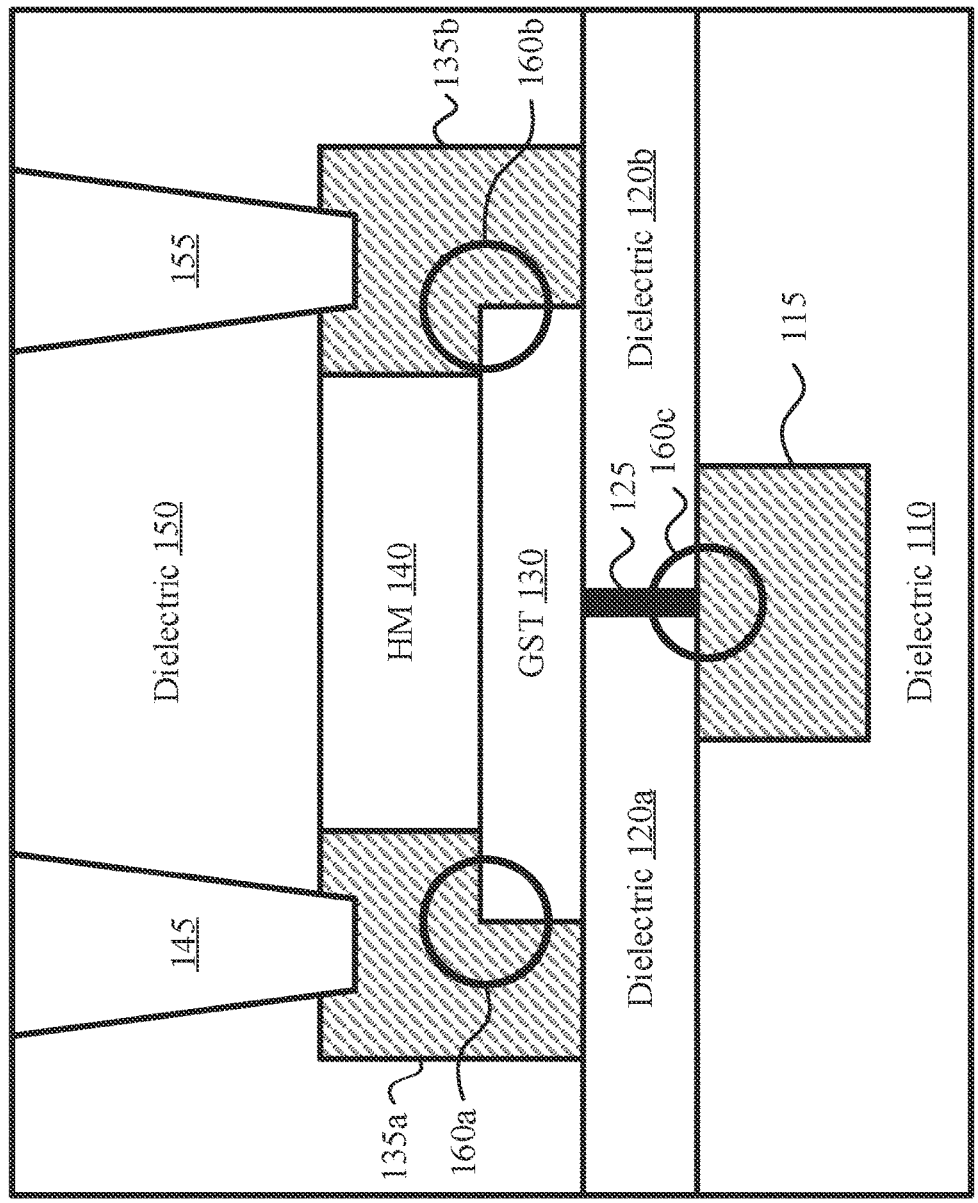
FIG. 1 depicts a schematic diagram of a first exemplary phase change memory cell with three terminals and self-aligning contacts, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to phase change memory and, more specifically, to preventing high resistance drift within a phase change memory through a phase change memory cell with three terminals and self-aligned metal contacts. While the present disclosure is not necessarily limited to such applications, various aspects of the disclosure may be appreciated through a discussion of various examples using this context.

A phase change memory (PCM) may include a bottom electrode and a top electrode with a phase change material between the two. As discussed above, conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode and/or the bottom electrode contact) that sends current pulses through the heater and into the phase change material. In some embodiments, the heater is the bottom electrode. In some embodiments, the heater is patterned on top of the bottom electrode.

When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline.

When the phase change material (of the phase change memory) is in an amorphous state (or a RESET state, as it is sometimes referred to), the phase change material may have a high resistivity and a low conductivity (i.e., high electrical resistivity and low electrical conductivity), and current may not travel quickly through the phase change material. Alternatively, when the phase change material is in a crystalline state (or a SET state, as it is sometimes referred to), the phase change material may have a low resistivity and a high conductivity (i.e., low electrical resistivity and high electrical conductivity), and current may travel quickly through the phase change material. The data may be stored in the phase change memory (PCM) using the contrast between the resistances of the two states (or phases). Further, each state may correspond to a binary value, with an amorphous state corresponding to a 0 and a crystalline state corresponding to a 1. PCM has many benefits, such as increased speeds (compared to other types of memory), non-volatile capabilities, less power requirements, etc., however, conventional PCMs may have abrupt changes between the phases, particularly at the amorphous state (i.e., an abrupt change to the RESET state).

Resistance, as referred to herein, may be an electrical resistance, and may refer to the opposition of current flow through an object. Resistivity, as referred to herein, may be an electrical resistivity, and may refer to the resistance (i.e., electrical resistance) per unit area of an object and/or material. Resistivity may, for example, be calculated using the magnitude of the electric field and the magnitude of the current density (i.e., the magnitude of the electric field divided by the magnitude of the current density). Resistance may be calculated, for example, by multiplying the resistivity by the length of the object and/or material and dividing by the cross-sectional area of the object and/or material. When resistivity remains constant, the resistance of an object can be changed by changing the length, width, etc. of the object. For example, a titanium nitride (TiN) material may have different amounts of resistance depending on the length, width, etc. of the TiN object, however the resistivity of TiN does not change due to changes in the dimensions of the object formed by the TiN.

Similarly, conductance, as referred to herein, may be an electrical conductance, and may refer to the ease of current flow through an object (i.e., how easily current flows through an object). Conductivity, as referred to herein, may be an electrical conductivity, and may refer to the conductance (i.e., electrical conductance) per unit area of an object and/or material. When conductivity remains constant, the conductance of an object can be changed by changing the length, width, etc. of the object. Resistivity and conductivity are intrinsic properties, whereas resistance and conductance are extrinsic properties.

In PCMs, when current travels through the heater, heat is generated (for instance, through the Joule heating effect) and the heat can change the phase of the phase change material from a crystalline to an amorphous phase (or vice versa, depending on the amount of heat and whether there is a quench). Therefore, the greater the electrical conductance or the lesser the electrical resistance (referred to herein as conductance and resistance, respectively), the greater the flow of current (at a particular voltage) traveling through the heater and the greater the amount of heat generated from the flowing current.

In some instances, phase change memories are designed so that there is a switching zone, commonly referred to as a mushroom cell, where the phase change material first starts to change phase (e.g., from crystalline to amorphous, or vice versa). This zone may form as a dome shape similar to a top of a mushroom, in some instances.

In conventional PCMs, the phase change material may experience resistance drift. Resistance drift occurs when the resistance of the phase change material increases over time. This is especially apparent in the amorphous phase of the phase change material (which has a higher resistance than the crystalline phase), whereas the crystalline phase may not be as susceptible to resistance drift. Therefore, the resistance drift issue may be referred to herein as high resistance drift, as the resistance drift occurs when the phase change material is in a high resistance phase (i.e., the amorphous phase). The high resistance drift may be caused by a structural relaxation of the amorphous phase change material (such as the amorphous mushroom cell, discussed above). The relaxation of the amorphous phase change material as well as the high resistance drift can affect the functionality of the PCM. As discussed above, the PCM functions and stores data through the change in resistance and the change in phase (i.e., from amorphous to crystalline, or vice versa) of the phase change material. If the resistance and structure of the amorphous phase has changed due to the structural relaxation and high resistance drift, than the PCM may not store data properly and may stop working all together.

The present disclosure provides a phase change memory, a system, and a method for preventing high resistance drift within a phase change memory through a phase change memory cell with three terminals and self-aligned metal contacts. As discussed above, high resistance drift is caused by the structural relaxation of the amorphous phase change material and/or the portion of the phase change material that is in the amorphous phase (such as an amorphous mushroom cell) over time. The relaxation may be caused over time through the use of the amorphous phase, as the amorphous phase may be exposed to large amounts of current and/or heat as well as quenching through the execution of a PCM. This may cause the amorphous phase to transition over time to an ideal glass state.

An ideal glass state may be an ideal state that is energetically favorable (i.e., more energetically favorable than the amorphous state that the PCM is typically in prior to the high resistance drifting). Glass may include particles that are solid and rigid but are also disordered. In a PCM, the amorphous phase may include a solid with disordered particles (and the crystalline phase may include a solid with ordered particles (such as in a lattice)). This amorphous phase may be glass-like but, in some instances, may not be quite as rigid as an ideal glass state. Therefore, the high resistance drift may cause the amorphous phase to relax and transition into the ideal glass state (for example, a more rigid state) which may increase the resistance of the amorphous phase.

To prevent the high resistance drifting, some embodiments of the present disclosure utilize a PCM with three terminals and self-aligned contacts. The three terminals may provide a resistance-read path that avoids the amorphous portion of the phase change material (for instance, the amorphous mushroom cell). Put more simply, when the phase change memory is executing read operations, the read path may avoid the amorphous portion of the phase change material due to the three terminal structure of the phase change memory. The amorphous portion of the phase change material may not be needed to perform read operations, but may be needed to perform write operations. In conventional PCMs, both the read and write paths may interact with the amorphous phase change material, which may cause the amorphous phase change material to experience resistance drift due to the frequent use (for instance, frequent heating and quenching) of the amorphous phase change material. Avoiding the amorphous phase change material when it is not needed may reduce the amount of heating and quenching done to the phase change material and the amorphous portion of the phase change material (e.g., the mushroom cell). This may help prevent, or at least delay, the high resistance drift of the amorphous phase change material.

In some embodiments, the three terminal PCM includes self-aligned contacts to help form the three terminals. Self-aligned contacts may be contacts that are able to align into position without much, if any, interference. Specifically, in this instance, the self-aligned contacts may be surrounded by dielectric, and the dielectric may help guide the contacts into their proper position without any outside interference. The contacts may be electrical contacts (for example, wires) that connect the PCM to other components of a computer system. In some instances, there may be two self-aligned contacts at a top portion of the PCM. These self-aligned contacts may help reduce variability and allow for a more symmetric formation of the amorphous phase change material (discussed further herein).

Figure 12:
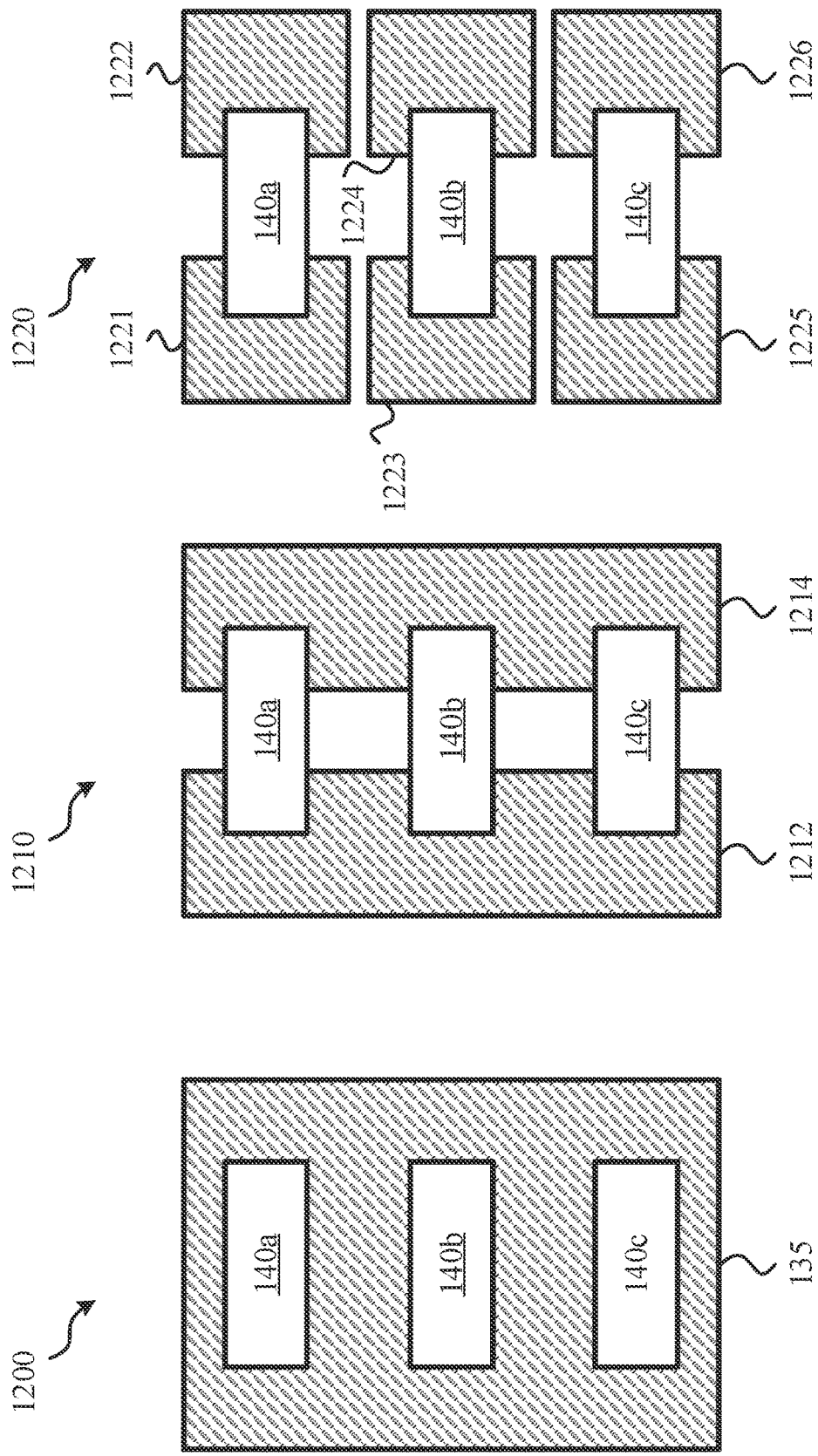
FIG. 12A depicts a schematic diagram of a top down view of a system with multiple phase change memory cells after the sixth intermediate step, according to some embodiments.
FIG. 12B depicts a schematic diagram of a top down view of a first exemplary system with multiple phase change memory cells after the seventh intermediate step, according to some embodiments.
FIG. 12C depicts a schematic diagram of a top down view of a second exemplary system with multiple phase change memory cells after the seventh intermediate step, according to some embodiments.

Referring now to FIG. 1, a schematic diagram of a first exemplary phase change memory cell 100 with three terminals 160a-160c and self-aligned contacts 145 and 155 is depicted, according to some embodiments. Terminals (e.g., 160a-160c), as referred to herein, may be locations of concentrations of charge that help direct read and write paths through a PCM. In some embodiments, a system may include a single phase change memory cell. In some embodiments, a system may include a plurality of phase change memory cells (such as depicted in FIGS. 12A-12C). FIG. 1 depicts a cross-section of phase change memory cell 100.

Phase change memory cell 100 includes a bottom electrode 115, a heater 125, and a phase change material—GST 130. Although GST 130 is depicted as the phase change material, phase change memory cell 100 could include any type of phase change material. Phase change memory cell 100 also includes a metal 135a and 135b (referred to collectively as metal 135), a hard mask (HM) 140, and two contacts 145 and 155. Bottom electrode 115 may be described as proximately connected to heater 125, heater 125 may be described as proximately connected to GST 130, GST 130 may be described as proximately connected to HM 140, metal 135 may be described as proximately connected to both HM 140 and GST 130, and contacts 145 and 155 may be described as proximately connected to metal 135. As used herein, the term "proximately connected" describes a connection between two components in relation the remainder of one of those components. For example, as mentioned above, bottom electrode 115 may be described as proximately connected to heater 125. However, bottom electrode 115 may not be described as proximately connected to GST 130, as there are other components separating the two.

The bottom electrode 115 may send current pulses through the heater 125 and into GST 130. These current pulses may change the phase of GST 130 and/or portions of GST 130 from crystalline to amorphous, or vice versa, in order to read and/or write data to or from the phase change memory cell 100. HM 140 may protect GST 130, specifically the top portion of GST 130, from being exposed to too much heat from the metal 135. In some embodiments, HM 140 may include silicon (Si). Metal 135 may surround HM 140 and GST 130 and may, in some instances, act as a top electrode within the phase change memory cell 100. Further, contacts 145 and 155 may be electrical contacts (such as wires) that connect phase change memory cell 100 to other portions of the system. These contacts may be self-aligned contacts. As both metal 135 and contacts 145 and 155 are made of metal materials, they may transmit heat and/or current within the phase change material. Therefore, the current pulses transmitted from the bottom electrode 115 and/or heat generated from these current pulses may reach metal 135 and/or contacts 145 and 155. Hard mask (HM) 140 may be used to prevent this current and/or heat from surrounding the GST 130 (as opposed to primarily coming from heater 125 and metal 135). Further, HM 140 may protect the top portion of GST 130 from any etching dome to metal 135 and/or dielectric 150.

Metal 135 and contacts 145 and 155 may be surrounded by dielectric 150, heater 125 may be surrounded by dielectric 120 (depicted as dielectric 120a and 120b), and bottom electrode 115 may be surrounded by dielectric 110. The dielectrics 110, 120, and 150 may protect the metal components (such as the heater 125, metal 135, and contacts 145 and 155 and prevent any other components of the computer system (i.e., outside of the PCM cell 100) from being exposed to the current/heat from these components. As an example, the dielectrics 110, 120, and/or 150 may be low-k dielectric(s). In some embodiments, dielectrics 110, 120, and/or 150 may be made up of silicon nitride (SiN), silicon dioxide ($SiO_2$), or any other dielectric material. These may be insulator materials that prevent heat transfer, in some instances. Metal 135, heater 125, and/or bottom electrode 115 may be made up of tantalum nitride (TaN), titanium nitride (TiN), titanium, etc.

Phase change memory cell 100 also includes three terminals 160a, 160b, and 160c (referred to collectively as terminals 160). Because HM 140 does not extend the entire width of GST 130, there is additional contact between metal 135 and GST 130. The additional contact helps establish the terminals 160a and 160b in the corner intersections of GST 130 and metal 135. The contact between heater 125 and bottom electrode 115 may help establish terminal 160c at the intersection between the heater 125 and the bottom electrode 115. These three terminals 160 may exchange signals and logic operations, in some instances. In some embodiments, as depicted in FIG. 1, terminals 160 may be located at areas of intersection between materials. In FIG. 1, terminals 160a and 160b are located at areas of intersection between metal 135 and GST 130, and terminal 160c is located at an area of intersection between bottom electrode 115 and heater 125. In some embodiments, as described herein and depicted in FIG. 13, the terminals may be at slightly different areas of intersection. In both instances, the top terminals may be in areas near and/or proximately connected to the metal 135, and the bottom terminal may be in an area near and/or proximately connected to the heater 125. As the metal 135 and heater 125 are conductors, the terminals may be at areas of intersection connected to these conductors.

Figure 2:
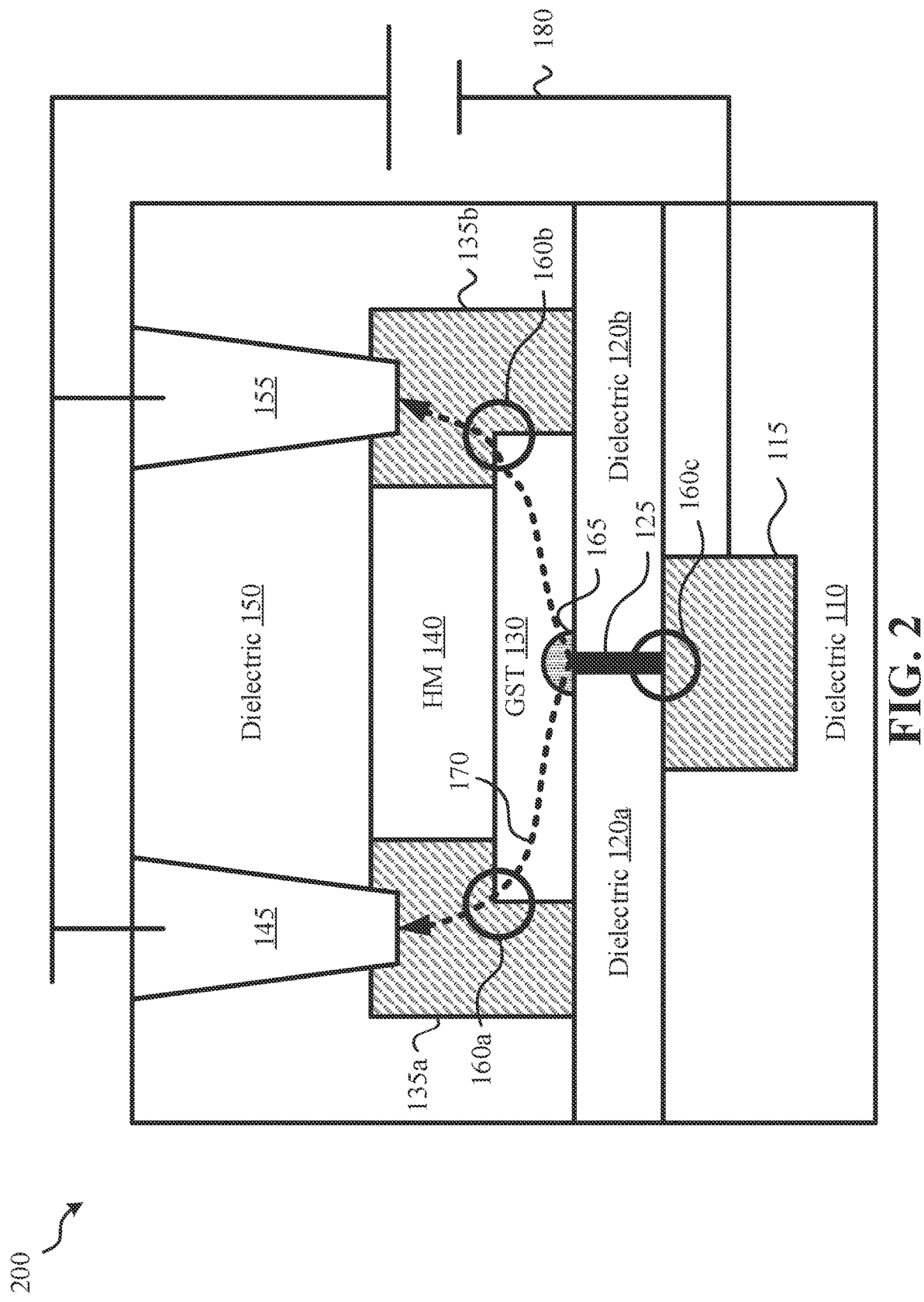
FIG. 2 depicts a schematic diagram of a write path through a three terminal phase change memory cell, according to some embodiments.

Referring to FIG. 2, a schematic diagram of a write path 170 through a three terminal phase change memory cell 200 is depicted, according to some embodiments. Phase change memory cell 200 may be the same as phase change memory cell 100 (FIG. 1). In phase change memory cell 200, an amorphous portion 165 of the phase change material has been formed. This may be referred to as amorphous mushroom 165. The remainder of the phase change material (GST 130) may be in a crystalline phase.

When a write operation is performed, current may be exchanged between the top contacts 145 and 155 as well as the bottom electrode 115. This is shown by the circuit diagram 180, which indicates that all three components (contact 145, contact 155, and bottom electrode 115) are engaged and are part of the same circuit. When all three components (contact 145, contact 155, and bottom electrode 115) are engaged, all three terminals 160 may also be engaged. Terminal 160c may draw the write path 170 downwards (as opposed to only terminals 160a and 160b being engaged—depicted in FIG. 3) and through the amorphous phase change material 165. This may be beneficial for a write operation, as writing within a phase change memory may otherwise require a RESET state (which, as mentioned herein, includes an amorphous state). Therefore, a write operation in phase change memory cell 200 may require an amorphous phase such as amorphous mushroom 165 and write path 170 may travel through the amorphous mushroom 165.

Figure 3:
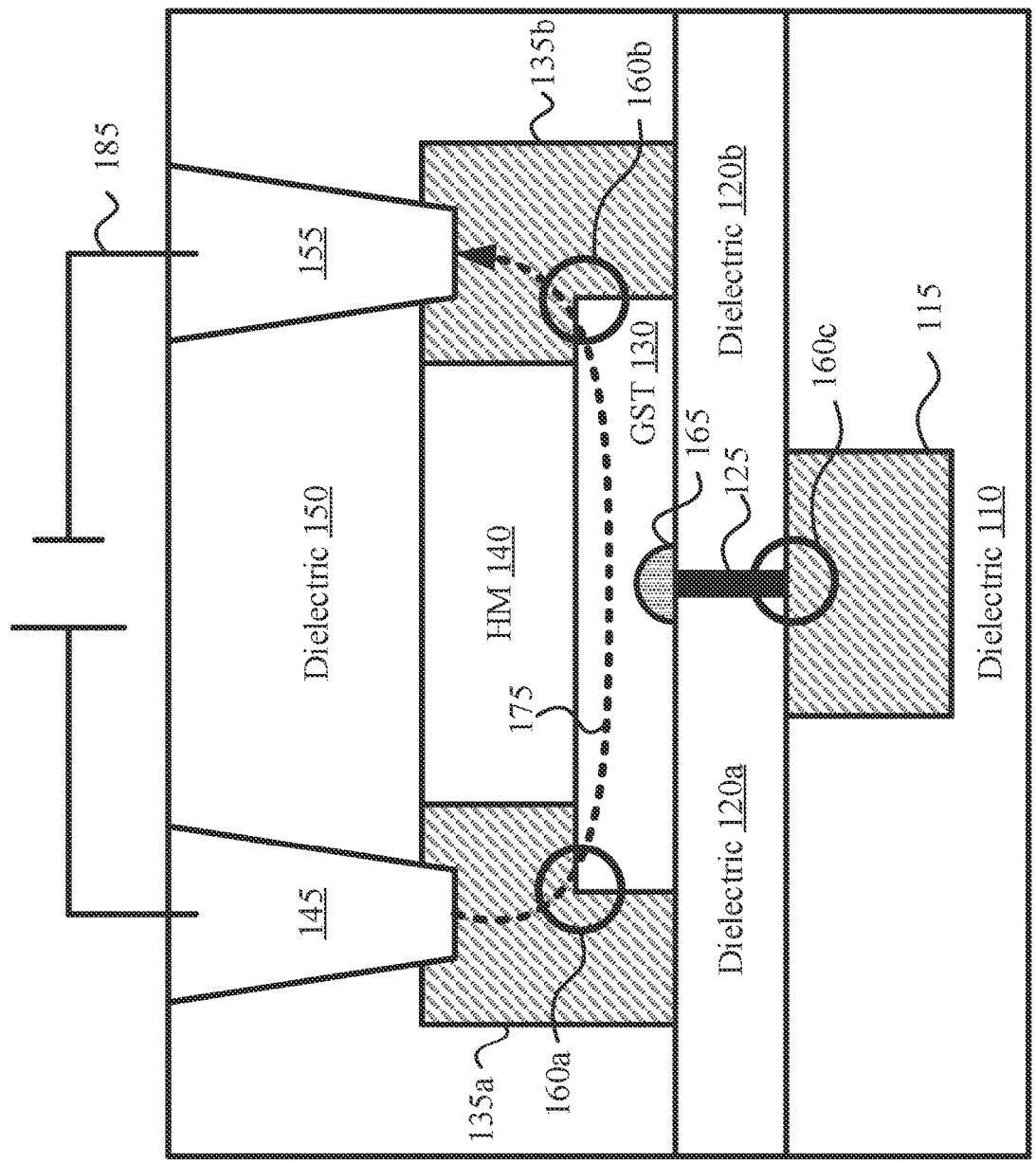
FIG. 3 depicts a schematic diagram of a read path through a three terminal phase change memory cell, according to some embodiments.

Referring to FIG. 3, a schematic diagram of a read path 175 through a three terminal phase change memory cell 300 is depicted, according to some embodiments. Phase change memory cell 300 may be the same as phase change memory cell 200 (FIG. 2). In these instances, phase change memory cell 200 may depict what occurs when the phase change memory cell is performing write operations and phase change memory cell 300 may depict what occurs when the phase change memory cell is performing read operations. Phase change memory cell 300 may be the same as phase change memory cell 100 (FIG. 1) in some instances.

As opposed to writing within a phase change memory, reading within a phase change memory may require a SET state (which, as mentioned herein, includes a crystalline state) and may not require any amorphous states. Therefore, reading may not require any interaction with amorphous mushroom 165. When performing a read operation, only contacts 145 and 155 may be engaged, while bottom electrode 115 may not be engaged. This is shown by the circuit diagram 185, which indicates that only two components (contact 145 and contact 155) are engaged and are part of the circuit 185. As only contacts 145 and 155 may be transmitting signals during a read operation, only terminals 160a and 160b may be engaged during a read operation. Terminal 160c may not be engaged. This may bring the read path 175 away from amorphous phase 165, as the read path may only travel through terminals 160a and 160b and may not be pulled towards terminal 160c (as opposed to write path 170 (FIG. 2)). Without any pull towards terminal 160c, and due to the locations of terminals 160a and 160b, read path 175 may avoid amorphous phase 165. By avoiding amorphous phase 165, the read operations (and the read paths 175) may not contribute to any high resistance drift of the amorphous phase 165, which helps reduce and/or eliminate high resistance drift of the amorphous phase 165.

Figure 4:
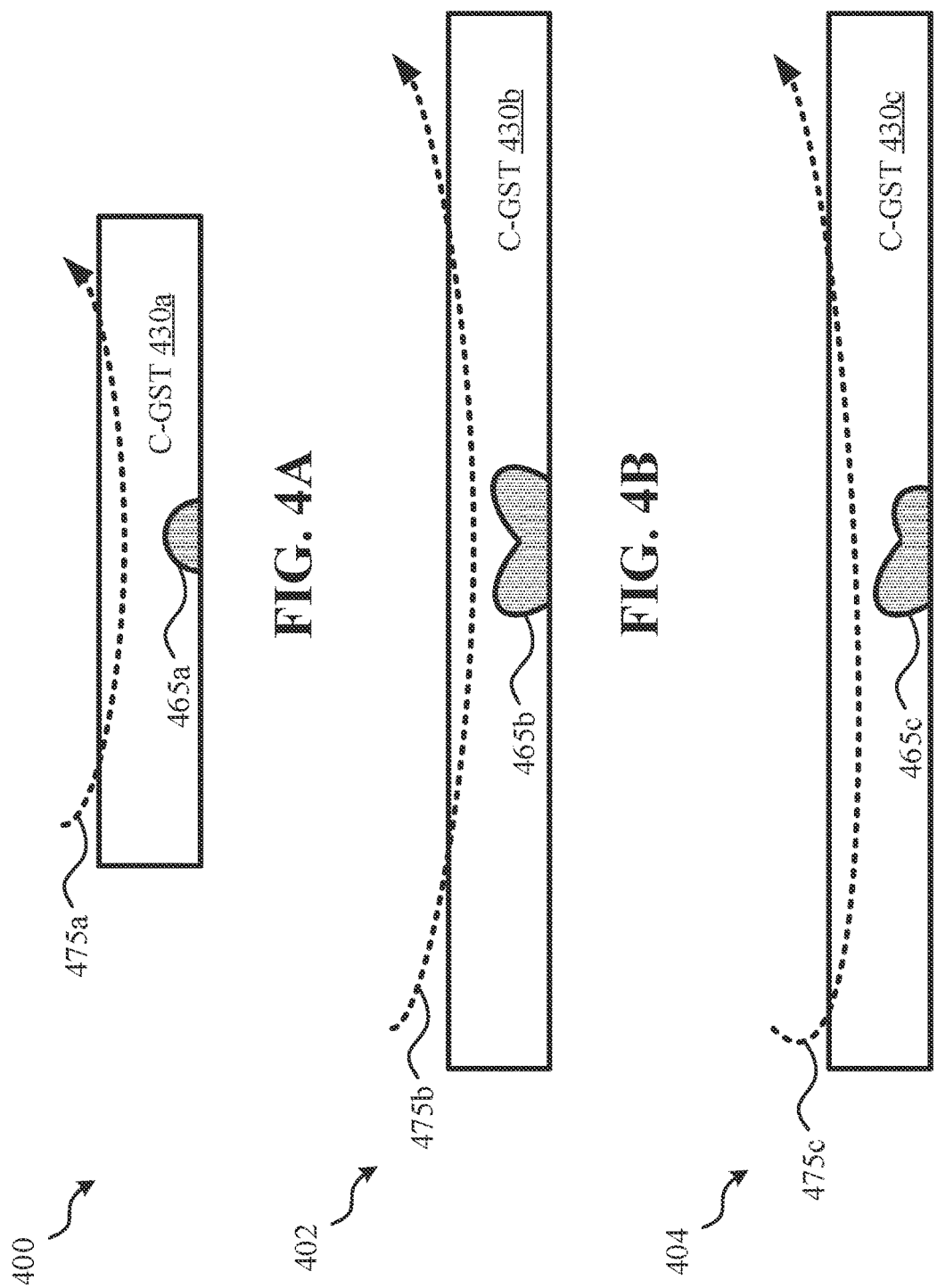
FIG. 4A depicts a schematic diagram of a first read path through a first phase change material, according to some embodiments.
FIG. 4B depicts a schematic diagram of a second read path through a second phase change material with an increased width, according to some embodiments.
FIG. 4C depicts a schematic diagram of a third read path through a third phase change material, according to some embodiments.

Referring to FIG. 4A, a schematic diagram of a first read path 475a through a first phase change material is depicted, according to some embodiments. The phase change material includes a crystalline portion and an amorphous portion. In this example, the phase change material is GST. FIG. 4A depicts the crystalline portion of the phase change material as crystalline GST (or C-GST) 430a and the amorphous portion as amorphous GST (or A-GST) 465a. In some embodiments, read path 475a may correspond to read path 175 (FIG. 3), C-GST 430a may correspond to GST 130 (FIG. 3), and amorphous mushroom 465a may correspond to amorphous mushroom 165 (FIG. 3).

In some instances, as depicted in FIG. 4A, the width of the phase change material as well as the locations of the contacts (not depicted) may result in a single symmetrical amorphous mushroom cell 465a. However, in some instances, the amorphous phase change material may not appear in a similar shape to a mushroom top, and may instead include two humps, as depicted in FIG. 4B (se amorphous mushroom cell 465b). This may occur in instances where the phase change material is wider (than C-GST 430a) as the current transmitted from the bottom electrode (such as bottom electrode 115) may travel towards the upper terminals (such as terminals 160a and 160b) and the contacts (such as contacts 145 and 155).

Therefore, referring now to FIG. 4B, a schematic diagram of a second read path 475b through a second phase change material with an increased width is depicted, according to some embodiments. The phase change material includes a crystalline portion and an amorphous portion. In this example, the phase change material is GST. FIG. 4B depicts the crystalline portion of the phase change material as crystalline GST (or C-GST) 430b and the amorphous portion as amorphous GST (or A-GST) 465b.

In conventional PCMs, the amorphous phase change material may not be symmetric due to the layout of the PCM cell. However, A-GST 465b is symmetric. This may be because the location of the contacts (such as contacts 145 and 155) at a top area of the PCM cell as well as the self-aligned scheme of the contacts allow for a more symmetric formation of A-GST 465b. In some instances, the top contacts (such as contacts 145 and 155) may be grounded during WRITE operations, which may also help the amorphous phase change material 465b remain symmetric.

In some instances, it may be beneficial to have an asymmetric phase change material, such as amorphous GST 465c, and to have the ability to selectively tune the shape of the amorphous phase change material 465c. Therefore, referring now to FIG. 4C, a schematic diagram of a third read path 475c through a third phase change material is depicted, according to some embodiments. The phase change material includes a crystalline portion and an amorphous portion. In this example, the phase change material is GST. FIG. 4C depicts the crystalline portion of the phase change material as crystalline GST (or C-GST) 430c and the amorphous portion as amorphous GST (or A-GST) 465c.

In this instance, reading path 475c is altered to selectively tune A-GST 465c such that the left portion of A-GST 465c has been converted to an amorphous phase quicker than a right portion of A-GST 465c. The reading path 475c may be altered through the contacts (such as contacts 145 and 155) and the terminals (such as terminals 160a and 160b).

Figure 5:
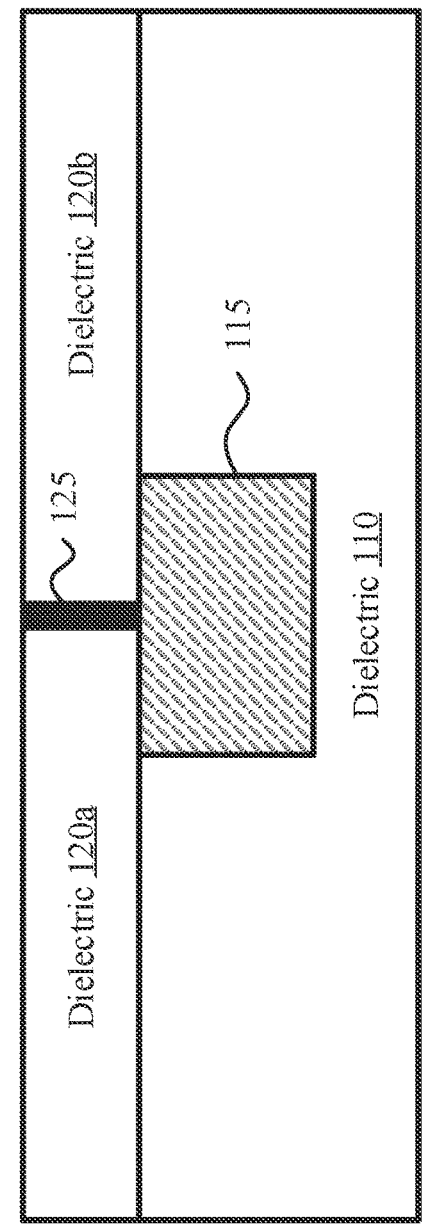
FIG. 5 depicts a schematic diagram of a first intermediate step when forming a three terminal phase change memory cell, according to some embodiments.

Referring now to FIG. 5, a schematic diagram of a first intermediate step 500 of forming a three terminal phase change memory cell is depicted, according to some embodiments. In some embodiments, intermediate step 500 is an intermediate step in forming three terminal phase change memory cell 100 (FIG. 1). In intermediate step 500, the heater 125 may be formed and the dielectric 120 may be deposited. Prior to intermediate step 500, the dielectric 110 may have been deposited, a via may have been etched into the dielectric 110, and the bottom electrode 115 may have been formed in the via opening. Once the bottom electrode 115 has been deposited, a heater 125 may be formed on top of the bottom electrode 115 and the dielectric 120 may be deposited surrounding the heater. The heater may be made up of TiN, TaN, titanium, etc. In some embodiments, the heater 125 is formed prior to the deposition of the dielectric 120. In some embodiments, the dielectric 120 is deposited, a via is etched in the dielectric 120, and then the heater 125 is formed within the via opening.

Figure 6:
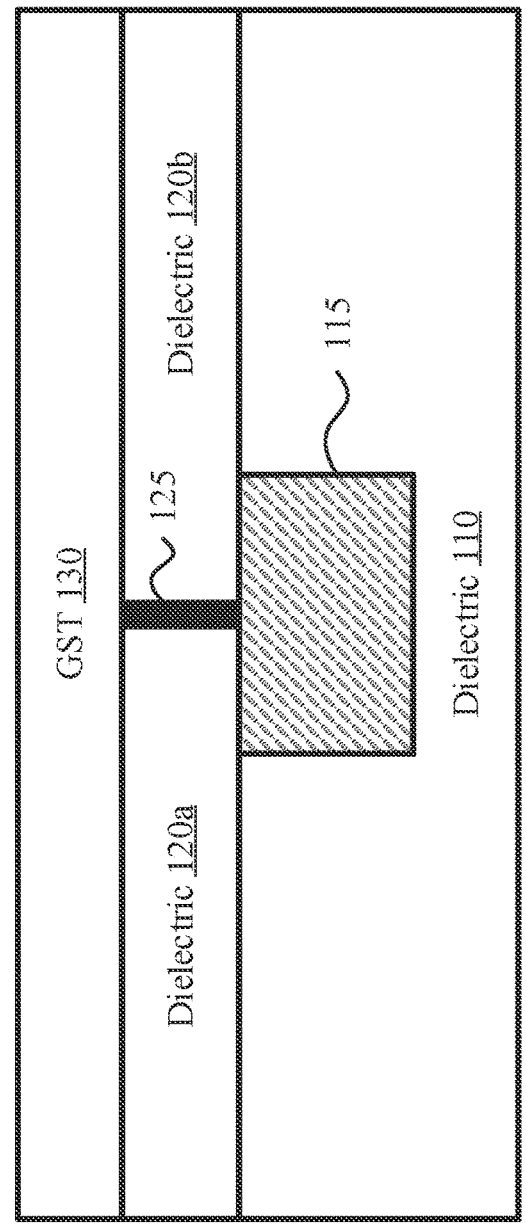
FIG. 6 depicts a schematic diagram of a second intermediate step when forming a three terminal phase change memory cell, according to some embodiments.

Referring to FIG. 6, a schematic diagram of a second intermediate step 600 when forming a three terminal phase change memory cell is depicted, according to some embodiments. In some embodiments, intermediate step 600 is an intermediate step in forming three terminal phase change memory cell 100 (FIG. 1). Intermediate step 600 includes depositing a thin layer of phase change material on top of the dielectric 120 and the heater 125. In this instance, the phase change material is GST 130, however other phase change materials may be used in some instances. In some embodiments, the phase change material (GST 130) undergoes crystallization in order to place GST 130 is a crystalline state. GST 130 may not become amorphous and/or partially amorphous until the PCM is fully formed and in use.

Figure 7:
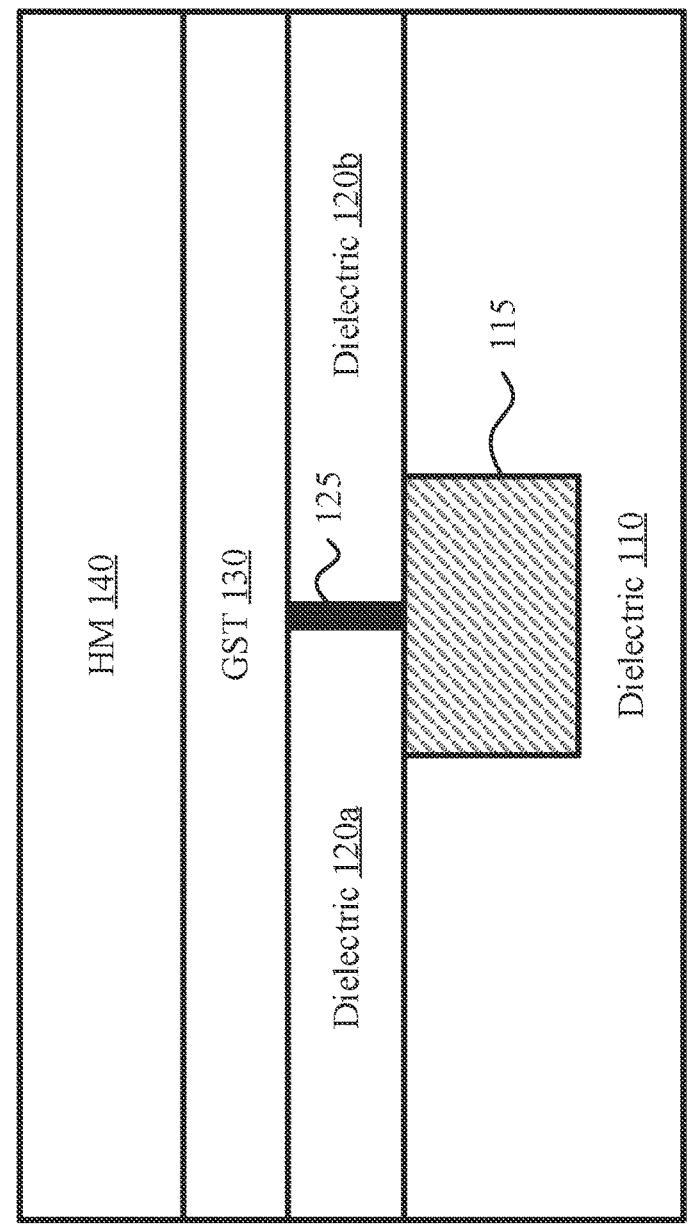
FIG. 7 depicts a schematic diagram of a third intermediate step when forming a three terminal phase change memory cell, according to some embodiments.

Referring to FIG. 7, a schematic diagram of a third intermediate step 700 when forming a three terminal phase change memory cell is depicted, according to some embodiments. In some embodiments, intermediate step 700 is an intermediate step in forming three terminal phase change memory cell 100 (FIG. 1). Intermediate step 700 may include depositing the hard mask (HM 140) material on top of (or proximately connected to) the GST 130. The HM 140 may protect the phase change material (GST 130) and may prevent the phase change material from being exposed to too much heat (for instance, from external devices). In some embodiments, HM 140 is made up of SiN. In some instances, the deposition can be done without air-break to the phase change material (GST 130). An air-break may be a pause in deposition in order to expose a layer to oxygen, water vapor, etc. However, GST 130 may not need an air-break before being covered by HM 140.

Figure 8:
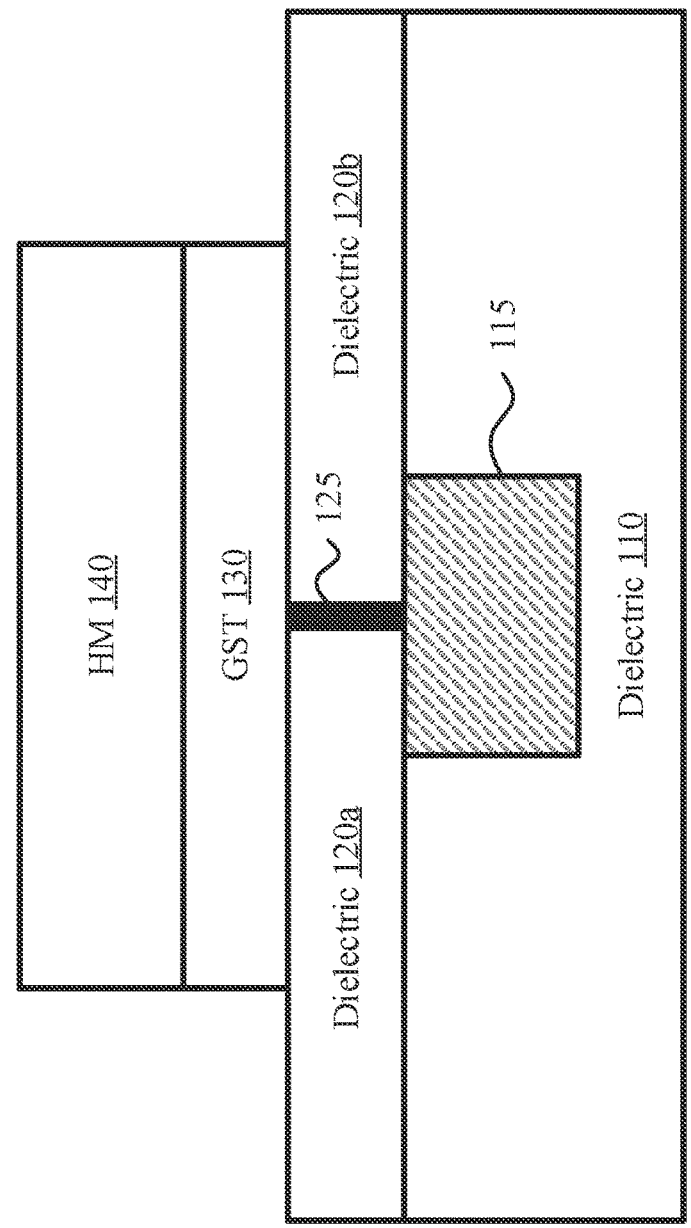
FIG. 8 depicts a schematic diagram of a fourth intermediate step when forming a three terminal phase change memory cell, according to some embodiments.

Referring to FIG. 8, a schematic diagram of a fourth intermediate step 800 when forming a three terminal phase change memory cell is depicted, according to some embodiments. In some embodiments, intermediate step 800 is an intermediate step in forming three terminal phase change memory cell 100 (FIG. 1). Intermediate step 800 may include patterning (such as etching) GST 130 and HM 140 such that they no longer span the entire width of dielectric 120. In some embodiments, patterning GST 130 and HM 140 includes etching GST 130 and HM 140. The etching may be dry etching such as reactive-ion etching (RIE), in some instances. Patterning GST 130 and HM 140 may help make space for a future metal deposition discussed herein and depicted in FIG. 10.

Figure 9:
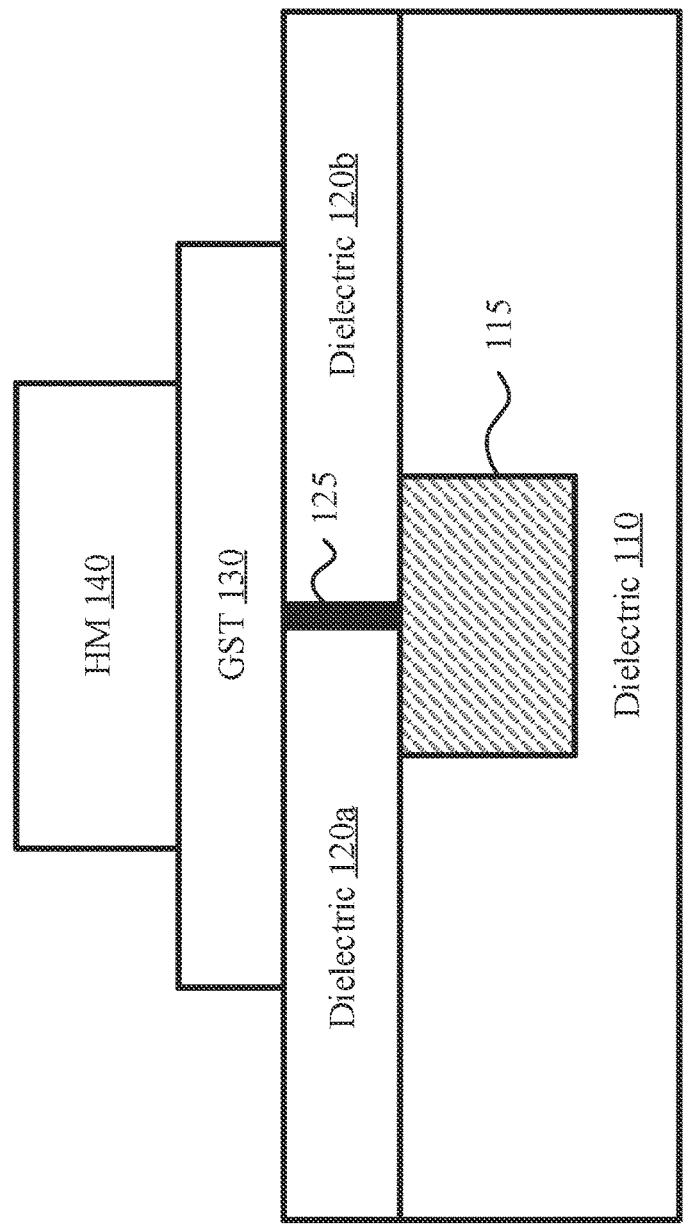
FIG. 9 depicts a schematic diagram of a fifth intermediate step when forming a three terminal phase change memory cell, according to some embodiments.

Referring to FIG. 9, a schematic diagram of a fifth intermediate step 900 when forming a three terminal phase change memory cell is depicted, according to some embodiments. In some embodiments, intermediate step 900 is an intermediate step in forming three terminal phase change memory cell 100 (FIG. 1). Intermediate step 900 may include conducting further patterning and/or trimming of HM 140. As discussed above, some of the terminals may be established at the corner intersections of GST 130 and the metals that have not yet been deposited. Therefore, the HM 140 may be further trimmed and/or etched in order to expose the corners of GST 130.

Figure 10:
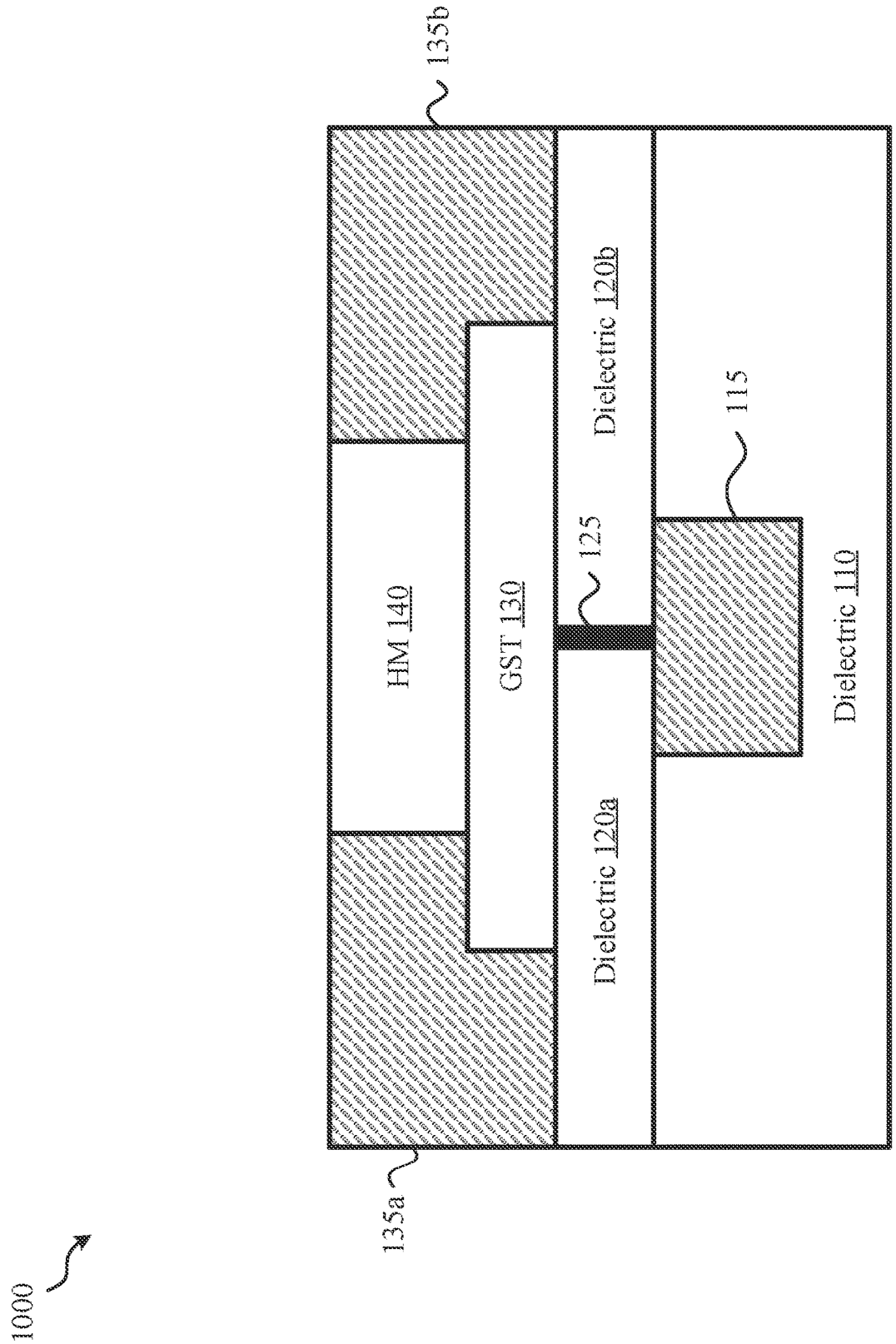
FIG. 10 depicts a schematic diagram of a sixth intermediate step when forming a three terminal phase change memory cell, according to some embodiments.

Referring to FIG. 10, a schematic diagram of a sixth intermediate step 1000 when forming a three terminal phase change memory cell is depicted, according to some embodiments. In some embodiments, intermediate step 1000 is an intermediate step in forming three terminal phase change memory cell 100 (FIG. 1). Intermediate step 1000 includes depositing metal 135. In some instances, the metal 135 may be deposited using techniques such as sputtering, evaporation, atomic layer deposition (ALD), chemical vapor deposition (CVD), laser induced chemical vapor disposition (LCVD), etc. The metal 135 may also be polished, for example, using chemical mechanical polishing (CMP). This may smooth any exposed surfaces of the metal 135. In some instances, exposed surfaces of the HM 140, dielectric 120, and dielectric 110 may all be polished in order to get rid of any rough edges and smooth out each surface.

Figure 11:
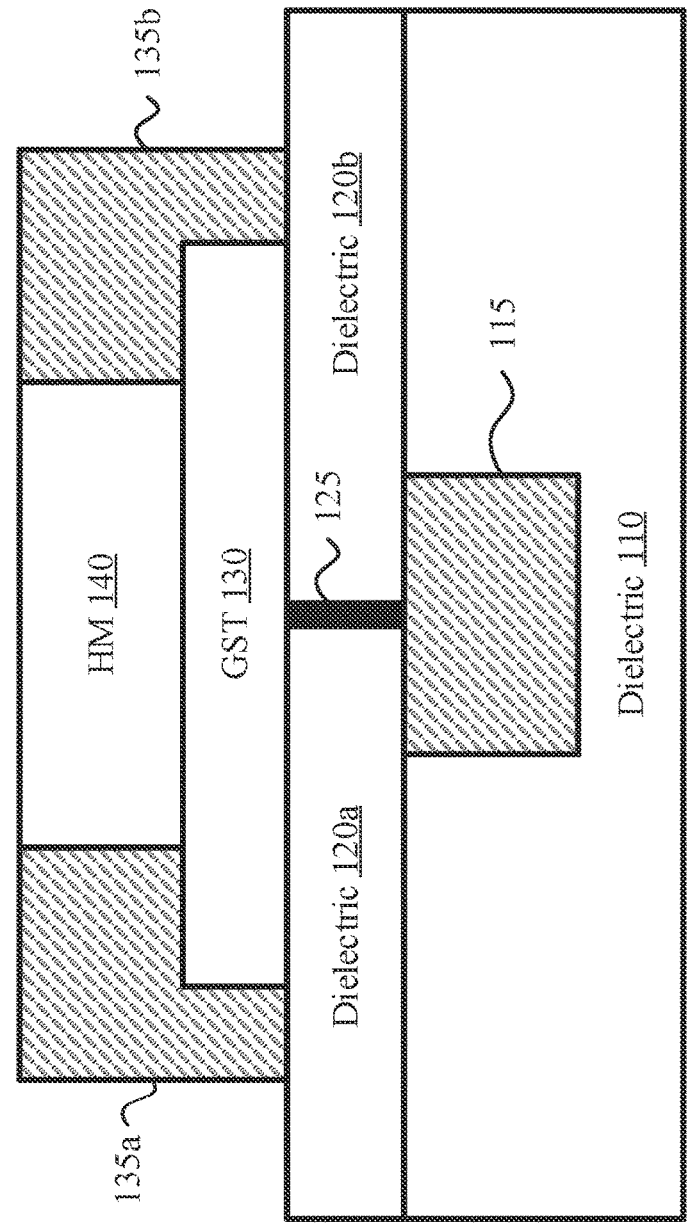
FIG. 11 depicts a schematic diagram of a seventh intermediate step when forming a three terminal phase change memory cell, according to some embodiments.

Referring now to FIG. 11, a schematic diagram of a seventh intermediate step 1100 when forming a three terminal phase change memory cell is depicted, according to some embodiments. In some embodiments, intermediate step 1100 is an intermediate step in forming three terminal phase change memory cell 100 (FIG. 1). Intermediate step 1100 may include patterning and/or etching the metal 135 so that its width is closer to the width of GST 130. This may help make sure the location of the two upper terminals (e.g., 160a and 160b (FIG. 1)) are located at the corner of GST 130 and the metal 135, as opposed to in the middle of metal 135 (and not at the intersection). For example, the terminals may have been located fully within metal 135 without touching, or having any intersection with, the GST 130 or other components. If the terminals were more within (e.g., in the middle of) metal 135, the read path of the phase change memory cell may not avoid the amorphous portion (e.g., amorphous mushroom) of the phase change material. For example, if the upper terminals were located to the right and left of GST 130—but without touching/intersecting GST 130, the terminals may cause the read path to lower and go directly through GST 130 and the amorphous mushroom. In some embodiments, the etching is a RIE. In some embodiments, the polishing (such as CMP) is not done until after the metal 135 is etched.

To finish forming the phase change memory cell (for example, going from intermediate step 1100 (FIG. 11) to the fully formed phase change memory cell 100 (FIG. 1)), the contacts may be formed. The contacts (e.g., 145 and 155 (FIG. 1)) may be used to connect the phase change memory cell to other components of the system. In some embodiments, the contacts may be interconnects. In some embodiments, by performing intermediate steps 500-1100, the contacts may be formed and connected without any (or at least with minimal) patterning on the PCM. This may help prevent etch damage that may induce variance and negatively affect the functioning of the PCM. Once the contacts are formed, dielectric (e.g., dielectric 150 (FIG. 1)) may be deposited to fill the open spaces of the phase change memory cell. For instance, the dielectric may surround the contacts (e.g., 145 and 155 (FIG. 1)). In some instances, the dielectric may also surround metal 135. In some instances, as depicted in FIG. 1, the dielectric (150) may line up with dielectric 120 horizontally and contacts 145 and 155 vertically.

Referring now to FIG. 12A, a schematic diagram of a top down view of a system 1200 with multiple phase change memory cells is depicted, according to some embodiments. FIGS. 1-11 have shown a cross-sectional view of a single phase change memory cell. However, in some instances, a system 1200 may include a plurality of phase change memory (PCM) cells. The top down view of the PCM cells may be HM 140a-140c. Put differently, each HM 140a-140c may correspond to a PCM cell. In some instances, the phase change memory cells may make up a single phase change memory for the system 1200. In some instances, each phase change memory cell is a phase change memory for a device, and the system 1200 includes a plurality of devices. System 1200 includes a plurality of phase change memory cells surrounded by metal 135. In some embodiments, system 1200 is depicted after the metal deposition in intermediate step 1000 (FIG. 10). When the metal 135 is patterned and/or etched in intermediate step 1100 (FIG. 11), the metal 135 between PCM cells and HM 140a-140c may also be etched for various benefits.

Referring to FIG. 12B, a schematic diagram of a top down view of an exemplary system 1210 with multiple phase change memory cells is depicted, according to some embodiments. In some embodiments, system 1210 is depicted after the patterning/etching in intermediate step 1100 (FIG. 11). The metal, in system 1210, has been patterned to form two rails 1212 and 1214. System 1210 may be a multi-device system, in some instances, with each PCM cell corresponding to a device within the multi-device system 1210. For instance, a first PCM cell may include HM 140a and rails 1212 and 1214, a second PCM cell may include HM 140b and rails 1212 and 1214, and a third PCM cell may include HM 140c and rails 1212 and 1214. The metal may not need to be completely separated between PCM cells and HMs 140a-140c, as the cells are all part of a multi-device system, therefore the two rails 1212 and 1214 may be sufficient without separation of the rails 1212 and 1214 between each PCM cell and HM 140a-140c.

Referring to FIG. 12C, a schematic diagram of a top down view of an exemplary system 1220 with multiple phase change memory cells is depicted, according to some embodiments. In some embodiments, system 1220 is depicted after the patterning/etching in intermediate step 1100 (FIG. 11). System 1220 may be a system made up of individual devices, therefore the devices may not remain connected, unlike the two rails 1212 and 1214 in system 1210, and the metal 135 (FIG. 0.12A) may be patterned/etched to separate the devices. Therefore, system 1220 may include individual metal portions for each device. Each HM 140a-140c may correspond to a device within system 1220. In system 1220, the first device may include HM 140a, metal 1221, and metal 1222; the second device may include HM 140b, metal 1223, and metal 1224; and the third device may include HM 140c, metal 1225, and metal 1226.

Figure 13:
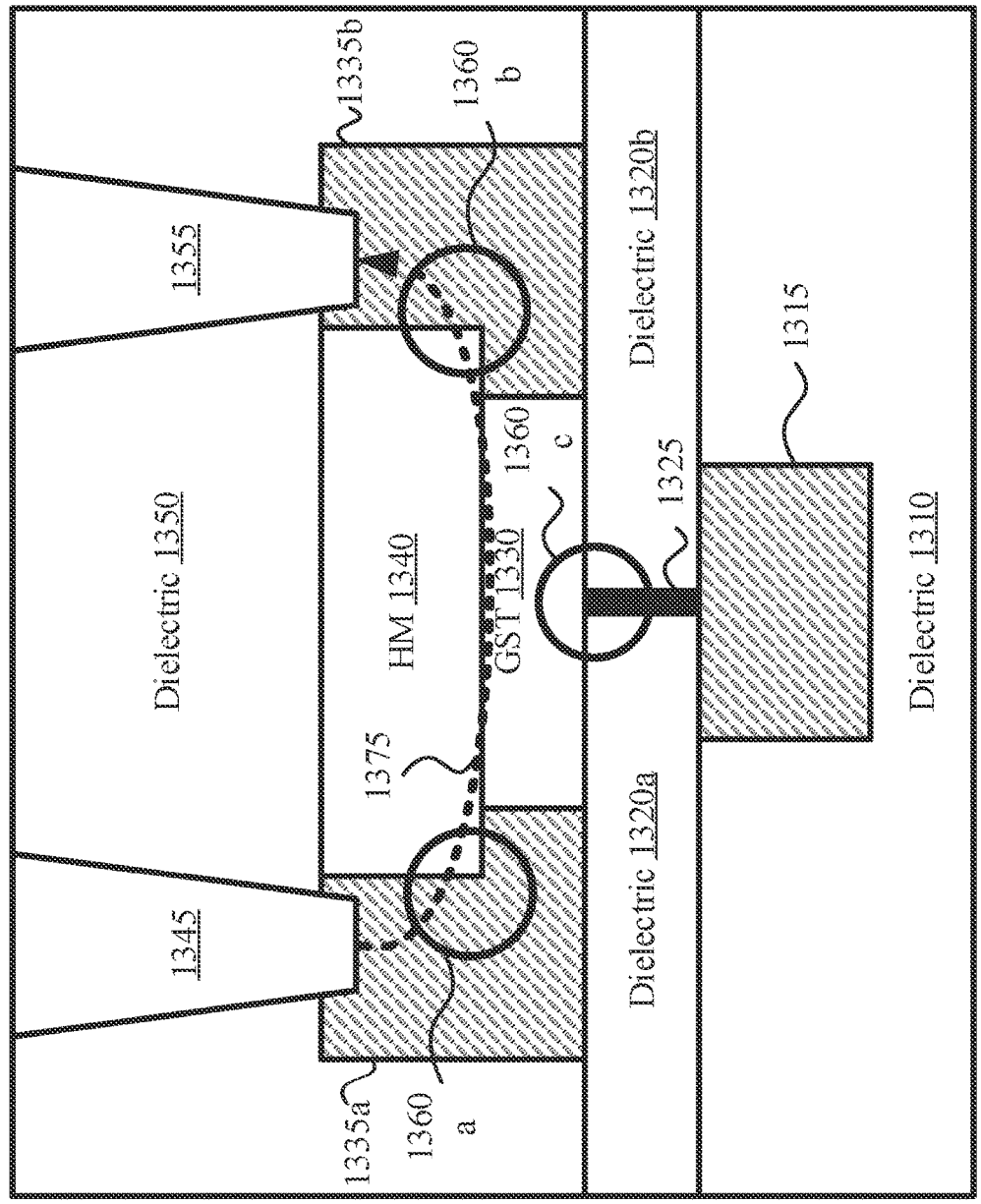
FIG. 13 depicts a schematic diagram of a second exemplary phase change memory cell with three terminals and self-aligned contacts, according to some embodiments.

Referring now to FIG. 13, a schematic diagram of a second exemplary phase change memory cell 1300 with three terminals and self-aligned contacts is depicted, according to some embodiments. Phase change memory cell 1300 is similar to phase change memory cell 100 (FIG. 1) and includes a dielectric 1310, a bottom electrode 1315, a heater 1325, a dielectric 1320, a GST 1330, a hard mask (HM) 1340, metal 1335, contacts 1345 and 1355, and dielectric 1350. However, in phase change memory cell 1300 the phase change material (GST 1330) is undercut and has a lesser width than HM 1340. In phase change memory cell 100 (FIG. 1), the phase change material (GST 130) is wider to help make sure that the amorphous area of the phase change material is distanced from any heat travelling through the metal (135).

However, in phase change memory cell 1300, having the HM 1340 wider than GST 1340 may bring the locations of the terminals 1360a-1360c higher (compared to the terminals 160a-160c in FIG. 1). For instance, the two upper terminals 1360a and 1360b may be at the intersections of the corners of the HM 1340 and the metal 1335 (as opposed to the corners of GST and metal 1335, which is the case in FIG. 1). The lower terminal 1360c is at an intersection between the heater 1325 and GST 1330 (as opposed to the intersection between bottom electrode 1315). Bringing the terminals 1360a-1360c higher may also bring the read path 1375 higher. With the upper terminals 1360a and 1360b located between the HM 1340 and the metal 1335, the read path 1375 may primarily travel through the HM 1340 and may significantly avoid the GST 1330. This prevents the read path 1375 from interacting with any amorphous phase of the phase change material (GST 1330) which may prevent and/or reduce high resistance drifting for the amorphous phase change material.

Figure 14:
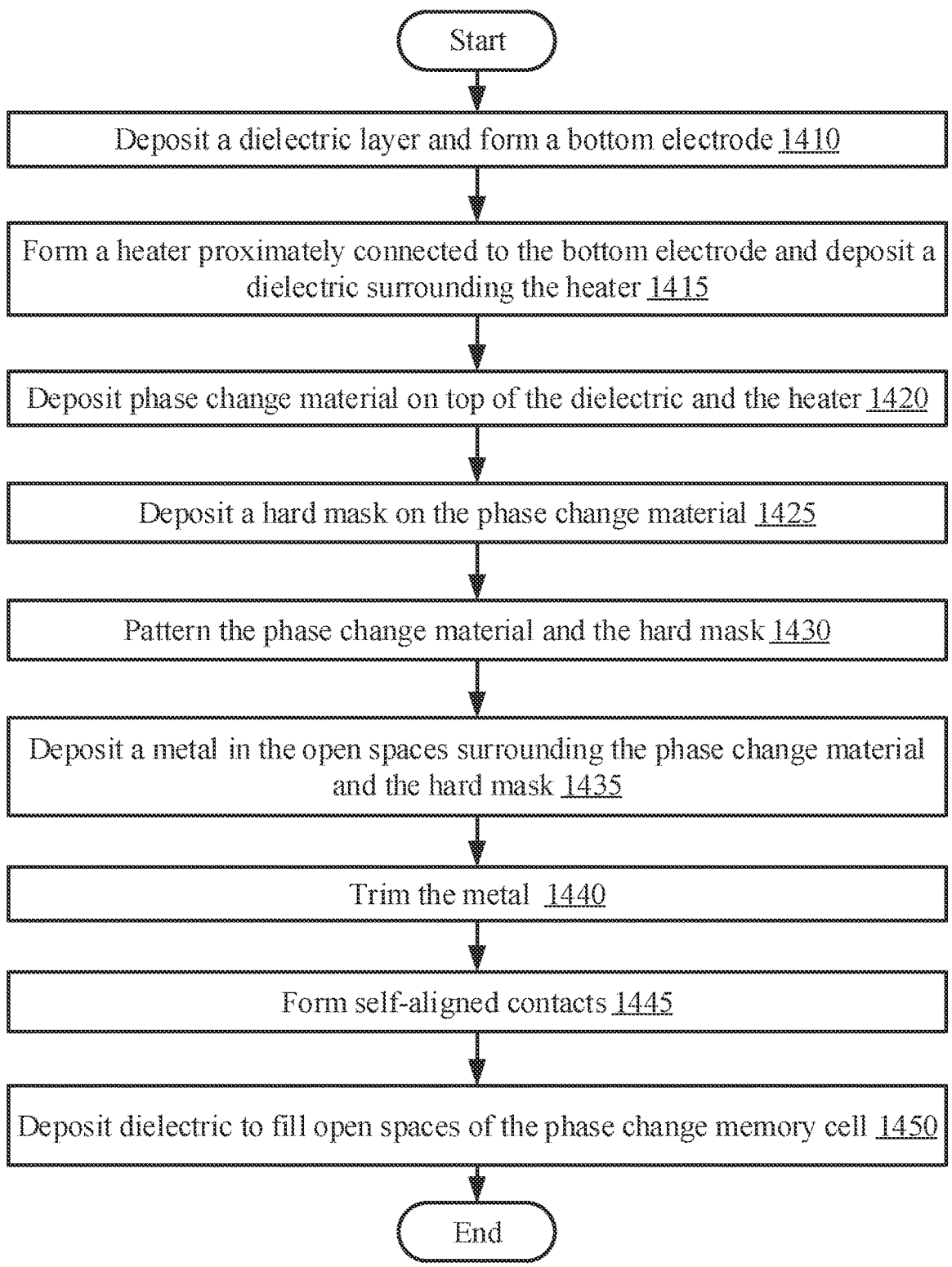
FIG. 14 depicts a flowchart of an exemplary method for forming a three terminal phase change memory cell with self-aligned contacts, according to some embodiments.

Referring to FIG. 14 depicts a flowchart of an exemplary method 1400 for forming a three terminal phase change memory cell with self-aligned contacts is depicted, according to some embodiments. In some embodiments, method 1400 is a method for forming phase change memory cell 100 (FIG. 1, phase change memory cell 200 (FIG. 2), phase change memory cell 300 (FIG. 3), and/or phase change memory cell 1300 (FIG. 13).

Method 1400 includes operation 1410 to deposit a dielectric layer and form a bottom electrode. In some embodiments, the dielectric layer is deposited, a via is patterned into the dielectric layer, and the bottom electrode is deposited in the via opening. Method 1400 also includes operation 1415 to form a heater (proximately connected to the bottom electrode) and deposit a dielectric surrounding the heater. This may correspond to intermediate step 500 (FIG. 5), discussed herein. Method 1400 also includes operation 1420 to deposit a phase change material (such as a GST) on top of the dielectric and the heater. A thin layer of phase change material may be deposited, for example, spanning the same/similar width as the dielectric. The phase change material may be proximately connected to the heater. In some embodiments, operation 1420 corresponds to intermediate step 600 (FIG. 6). Method 1400 also includes operation 1425 to deposit a hard mask on top of the phase change material. The hard mask may, for example, span the same/similar width as the phase change material. In some embodiments, operation 1425 corresponds to intermediate step 700 (FIG. 7).

Method 1400 includes operation 1430 to pattern/etch the phase change material and the hard mask. In some embodiments, both the phase change material and the hard mask may be patterned to a same smaller width (such as in intermediate step 800 (FIG. 8)) and then either the hard mask or the phase change material may be further trimmed/etched (for instance, through selective etching). For instance, if the phase change memory cell is phase change memory cell 100 (FIG. 1), the hard mask may be further trimmed such that the hard mask has a lesser width than the phase change material. This may correspond to intermediate step 900 (FIG. 9). In some instances, if the phase change memory cell is phase change memory cell 1300 (FIG. 13), the phase change material may be further trimmed such that the phase change material has a smaller width than the hard mask (i.e., the phase change material is undercut). In some embodiments, the phase change material may trimmed/etched prior to any deposition of the hard mask.

Method 1400 includes operation 1435 to deposit a metal in the open spaces surrounding the phase change material and the hard mask. This may correspond to intermediate operation 1000 (FIG. 10). In some instances, when a system includes a plurality of phase change memory cells, a top down view of the system once the metal has been deposited may correspond to system 1200 (FIG. 12A). In some embodiments, the metal may fill the open spaces that were created by the patterning/etching of the hard mask and the phase change material above the dielectric.

Method 1400 includes operation 1440 to trim the metal. This may help clean up any exposed edges of the metal after it has been deposited. In some instances, trimming the metal may include decreasing the width of the metal, which may help move the location of the terminals towards the phase change material and/or the hard mask. This may correspond to intermediate step 1100 (FIG. 11), in some instances. In some embodiments, when the system includes multiple phase change memory cells, trimming the metal may include patterning two rails of metal that are shared between phase change memory cells (such as depicted in system 1210 (FIG. 12B)). In some embodiments, when the system includes multiple phase change memory cells, trimming the metal may include patterning individual sections of metal for each phase change memory cell (such as depicted in system 1220 (FIG. 12C)).

Lastly, method 1400 includes operation 1445 to form self-aligned contacts and operation 1450 to deposit dielectric to fill open spaces of the phase change memory cell. The self-aligned contacts may be top contacts that connect the metal (deposited in operation 1435) with other components of a system. Filling open spaces of the phase change memory cell (for example, the spaces surrounding the top contacts) may help protect the contacts and prevent exposure to too much heat.

The present invention may be a system, a method, etc. at any possible technical detail level of integration. The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory comprising:
   a bottom electrode;
   a heater proximately connected to the bottom electrode;
   a phase change material proximately connected to the heater;
   a hard mask proximately connected to the phase change material, wherein the width of the hard mask is different than the width of the phase change material;
   metal proximately connected to at least two surfaces of the phase change material; and
   three terminals, wherein a bottom terminal is located at an area proximately connected to the heater and two top terminals are located at areas proximately connected to the metal.

2. The phase change memory of claim 1, wherein the phase change material is wider than the hard mask.

3. The phase change memory of claim 2, wherein:
   the top terminals are located at corner intersections between the phase change material and the metal; and
   the bottom terminal is located at an intersection between the heater and the bottom electrode.

4. The phase change memory of claim 1, wherein the hard mask is wider than the phase change material.

5. The phase change memory of claim 4, wherein:
   the top terminals are located at corner intersections between the hard mask and the metal; and
   the bottom terminal is located at an intersection between the heater and the phase change material.

6. The phase change memory of claim 1, further comprising two self-aligned contacts proximately connected to the metal.

7. The phase change memory of claim 1, wherein:
a portion of the phase change material is amorphous, resulting in an amorphous portion; and
a read path between the two top terminals does not flow through the amorphous portion.

8. A system comprising:
a phase change memory cell, the phase change memory cell comprising:
a bottom electrode;
a heater proximately connected to the bottom electrode;
a phase change material proximately connected to the heater;
metal proximately connected to at least two surfaces of the phase change material; and
three terminals, wherein a bottom terminal is located at an intersection between the heater and the phase change material and two top terminals are located at corner intersections between a hard mask and the metal.

9. The system of claim 8, further comprising:
self-aligned contacts proximately connected to the metal.

10. The system of claim 8, further comprising a plurality of phase change memory cells.

11. The system of claim 10, wherein each phase change memory cell comprises a plurality of metal rails shared between the plurality of phase change memory cells.

12. The system of claim 10, wherein each phase change memory cell comprises individual metal portions unshared between the plurality of phase change memory cells.

13. A method of forming a three terminal phase change memory, the method comprising:
depositing a phase change material proximately connected to a heater, wherein the heater is proximately connected to a bottom electrode;
depositing a hard mask on the phase change material;
patterning the phase change material and the hard mask;
depositing a metal on a dielectric such that the metal is proximately connected to the phase change material and the hard mask, wherein a bottom terminal is located at an area proximately connected to the heater and two top terminals are located at areas proximately connected to the metal; and
forming self-aligned contacts proximately connected to the metal.

14. The method of claim 13, wherein patterning the phase change material and the hard mask comprises:
trimming the hard mask to a smaller width than the phase change material.

15. The method of claim 13, wherein patterning the phase change material and the hard mask comprises:
trimming the phase change material to a smaller width than the hard mask.

16. The method of claim 13, further comprising:
trimming a width of the metal closer to a width of the phase change material and a width the hard mask.

17. The system of claim 8, further comprising:
a hard mask proximately connected to the phase change material, wherein the width of the hard mask is different than the width of the phase change material.

* * * * *